United States Patent [19]

Briley et al.

[11] Patent Number: 5,057,877
[45] Date of Patent: Oct. 15, 1991

[54] SUPERCONDUCTOR INTERCONNECTION APPARATUS

[75] Inventors: Bruce E. Briley, Countryside; Mikiel L. Larson, St. Charles; John Montsma, Wheaton, all of Ill.

[73] Assignee: AT&T Bell Laboratories, Murray Hill, N.J.

[21] Appl. No.: 602,898

[22] Filed: Oct. 26, 1990

Related U.S. Application Data

[63] Continuation of Ser. No. 402,390, Aug. 31, 1989, abandoned.

[51] Int. Cl.[5] .................... H01L 27/12; H01L 39/22; H01L 23/48; H01L 25/04
[52] U.S. Cl. ........................... 357/5; 357/4; 357/65; 357/79; 357/83; 505/1
[58] Field of Search ............... 357/4, 5, 65, 79, 83; 307/245; 505/1, 700, 856, 875

[56] References Cited

U.S. PATENT DOCUMENTS

| | | | |
|---|---|---|---|
| 4,454,522 | 6/1984 | de Lozanne | 357/4 |
| 4,499,655 | 2/1985 | Anthony | 357/65 |
| 4,837,609 | 6/1989 | Gurvitch et al. | 357/5 |
| 4,891,686 | 1/1990 | Krausse, III | 357/65 |

FOREIGN PATENT DOCUMENTS

| | | | |
|---|---|---|---|
| 0367630 | 5/1990 | European Pat. Off. | |
| 54-116894 | 9/1975 | Japan | 357/5 |
| 58-223383 | 12/1983 | Japan | 357/5 |
| 59-74690 | 4/1984 | Japan | 357/5 |
| 1-57683 | 3/1989 | Japan | 357/5 |
| 1-133379 | 5/1989 | Japan | 357/5 |

OTHER PUBLICATIONS

"Superconductor Landscape: View from Los Alamos", F. M. Mueller, *Advanced Materials & Processes*, vol. 133, Issue 1, Jan. 1988, pp. 79–81.
"An Overview of Josephson Packaging", A. V. Brown, IBM Journal of Research and Developement, vol. 24, No. 2, Mar. 1980, pp. 167–171.

*Primary Examiner*—J. Carroll
*Attorney, Agent, or Firm*—P. Visserman; W. Ulrich

[57] ABSTRACT

A structure connecting superconductor transmission lines to integrated circuits comprises a plurality of interconnection substrates having superconducting transmission path deposited thereon in contact with metallic contact areas, and integrated circuit chip carrier substrates for mounting integrated circuits and having metallic contact areas. The substrates are mounted in a retainer structure and are separated by spacers which have apertures in registration with the contact areas. Contact devices are selectively inserted in the apertures to establish an interconnection pattern between the substrates. The retainer structure applies force to the substrates to assure physical contact between the substrates and the contact device. The structure may be assembled and disassembled for replacement of parts or reconfiguration of interconnections, without the application of heat or other processes which are incompatible with relatively brittle and heat sensitive superconducting materials. The complete structure may be submerged in a bath of liquid nitrogen for cooling. The space provided by the spacers allows for access by the cooling liquid to the superconducting material on the substrates.

18 Claims, 3 Drawing Sheets

SUPERCONDUCTOR INTERCONNECTION APPARATUS

This application is a continuation of application Ser. No. 402,390, filed on Aug. 31, 1989, abandoned.

FIELD OF THE INVENTION

The invention relates to method and apparatus for interconnecting strips of superconducting material deposited on substrates. More specifically, the invention relates to an arrangement for interconnecting several such substrates with integrated circuit chip carriers.

BACKGROUND OF THE INVENTION

A problem of the prior art in highly integrated electronic circuitry is the physical design to physically support the integrated circuit chip, to make connections to the chip and provide transmission paths for high-frequency electronic signals transmitted by the integrated circuit. In the prior art, thin lines of metallic conductors, such as copper, have been deposited on substrates and connected by solder connection to the integrated circuits. Typically, conductors are deposited on both sides of a substrate and feed through holes are provided through the board to allow solder connections to be made to the conductors on either side. Furthermore, complex cross-over arrangements of plated metallic conductors are used in the prior art in order to support more transmission lines in a small area on a substrate in close proximity to the integrated circuit chip.

The recent discovery of ceramic materials which have superconducting properties at higher temperatures has stirred a renewed interest in practical application for superconductor materials. Ceramics, such as the commercially available material sometimes referred to as 1-2-3 ceramic material ($Y_1Ba_2Cu_3O_7$) which is superconducting at the temperature of liquid nitrogen ($N_2$), e.g., approximately 77 degrees Kelvin, can be deposited in thin layers and have desirable properties for the transmission of high-frequency signals. A problem is the construction of a carrier by which the superconducting lines can be brought into contact with the integrated circuit chips, since the techniques for fabricating and interconnecting the metallic striplines such as soldering and cross-over structures are incompatible with superconductor materials which are more brittle and more sensitive to the application of heat required.

SUMMARY OF THE INVENTION

These and other problems of the prior art are solved in accordance with this invention by providing superconducting transmission paths on an interconnection substrate in contact with plated metallic conductors, and providing an electrical contact between plated conductors on different substrates. In accordance with one embodiment of the invention, an assembly of substrates comprises an interconnection substrate and an integrated circuit carrier substrate, with the substrates each having metallic conductor contact areas which are forced in contact with each other by mechanical pressure. In accordance with another embodiment of the invention, the carrier substrate may be provided with metallic conductors on opposing surfaces and brought in contact with metallic conductors on a pair of substrates to increase the number of paths available to the chip carrier substrate.

In accordance with one aspect of the invention, the contact may be made between substrates by providing matching lands on the metallic conducting material where the contact is made between substrates. Alternatively, a spacer having a plurality of openings may be inserted between the metallic surfaces of the substrates to be brought in contact, and spherical or the like shaped contact devices consisting of conducting material may be selectively inserted in openings in the spacer material to selectively establish a pattern of interconnections between substrates.

Advantageously, the interconnection substrates, the chip carriers and spacers may be formed into a multiple layer stack structure with electrical contact established between layers by the pieces of conducting material inserted in apertures of the spacers. Furthermore, carrier substrates and interconnection substrates may be independently manufactured, and the substrates may be assembled into a circuit structure without soldering or other manufacturing techniques which may be incompatible with superconducting materials. Advantageously, in accordance with this invention, a repairable and reconfigurable integrated circuit structure is provided since individual layers may be removed and replaced without affecting other layers of the structure.

In one embodiment of the invention, a structure for connecting to a plurality of integrated circuits is made up of a plurality of layers of interconnection substrates having superconductive materials deposited thereon and carrier substrates having integrated circuit chips attached thereto, all connections to the integrated circuits being made via metallic conductors on the edges of the integrated circuit carrier which are selectively brought into contact with metallic conductors on the edges of interconnection substrates at opposing surfaces of the carrier substrate, and the interconnecting substrates carrying superconducting transmission paths are selectively brought in contact with each other by means of metallic edge conductors, in order to provide a completed circuit structure.

In accordance with one aspect of the invention, superconducting stripline transmission paths, comprising superconducting signal paths and ground planes, are deposited on interconnection substrates.

In one specific embodiment, an integrated circuit device mounted on the carrier substrate is comprised of optical receivers and transmitters, and fiber optic conductors are brought into proximity with the integrated circuits through apertures provided in the interconnection carriers.

BRIEF DESCRIPTION OF THE DRAWING

The invention may be better understood from the following detailed description when read with reference to the drawing in which.

DETAILED DESCRIPTION

Figure 1:
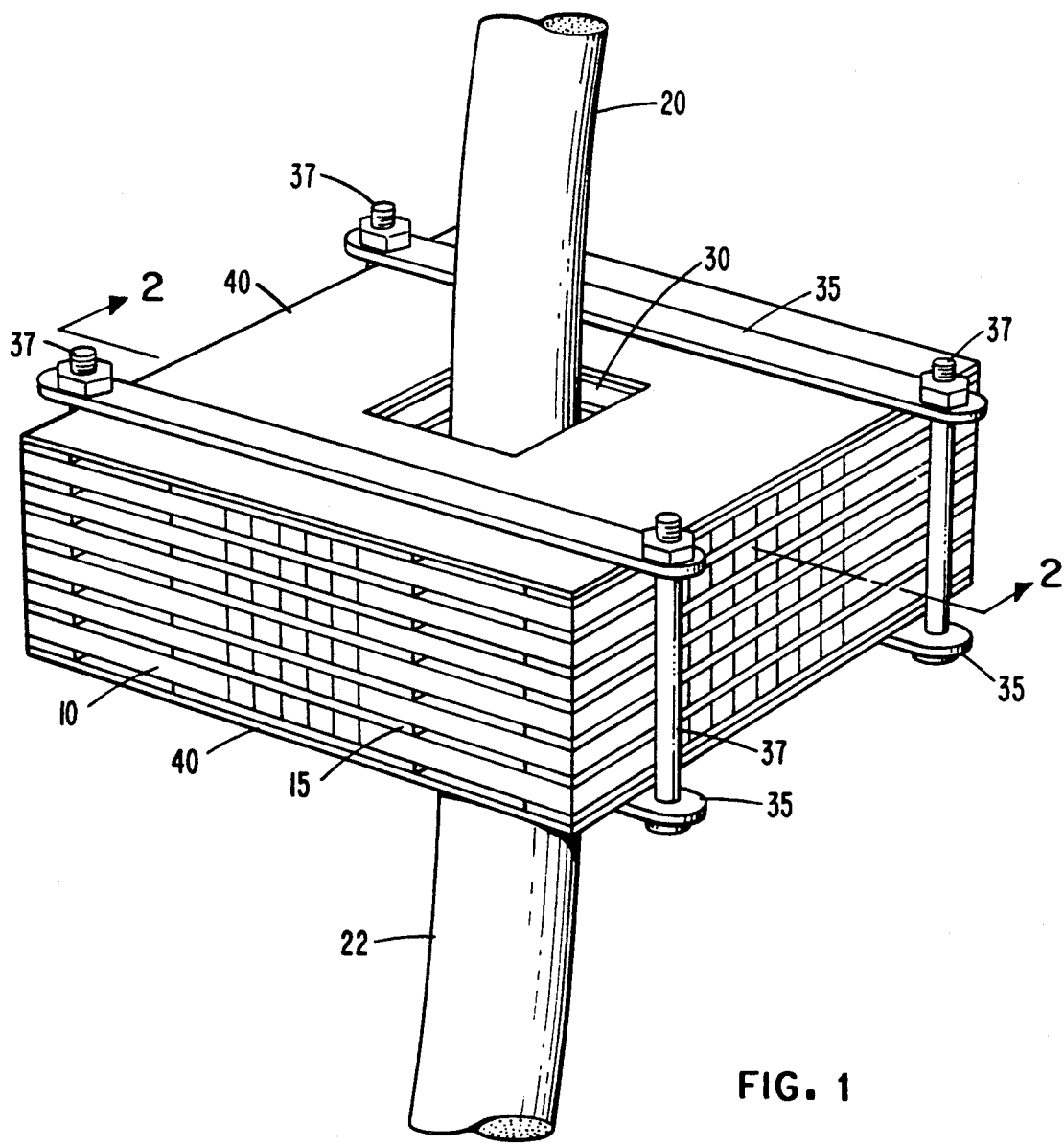
FIG. 1 is a representation of a multi-layered structure of substrates including interconnection substrates for supporting superconducting transmission lines and integrated circuit carrier substrates.

FIG. 1 is a representation of an integrated circuit carrier structure including a plurality of interconnection substrates 10 separated by spacers 15. FIG. 1 shows optical cables 20 and 22 which provide access to integrated circuit chips on carrier substrates disposed internal to the structure of FIG. 1 and accessible via aperture 30 which extends through various layers of the structure of FIG. 1. Apparatus for applying vertical pressure to keep the layers of the sandwich structure in tight contact comprises horizontally extending bars 35 and vertically extending rods 37 provided with threaded ends and hold down nuts, for forming a clamp. Cover plates 40 may be made of any substantially rigid material for distributing the pressure across the upper and lower surface of the structure. Other arrangements for keeping the layers of the structure in tight contact may be readily devised.

The structure of FIG. 1 may be submerged in a bath of liquid nitrogen to keep the superconducting material deposited on the interconnecting substrates at the desired temperature. The space between layers formed by the spacers 15 and the aperture 30, provide access for the cryogenic fluid to the superconducting material and also for the cooling of integrated circuits in the sandwich.

Figure 2:
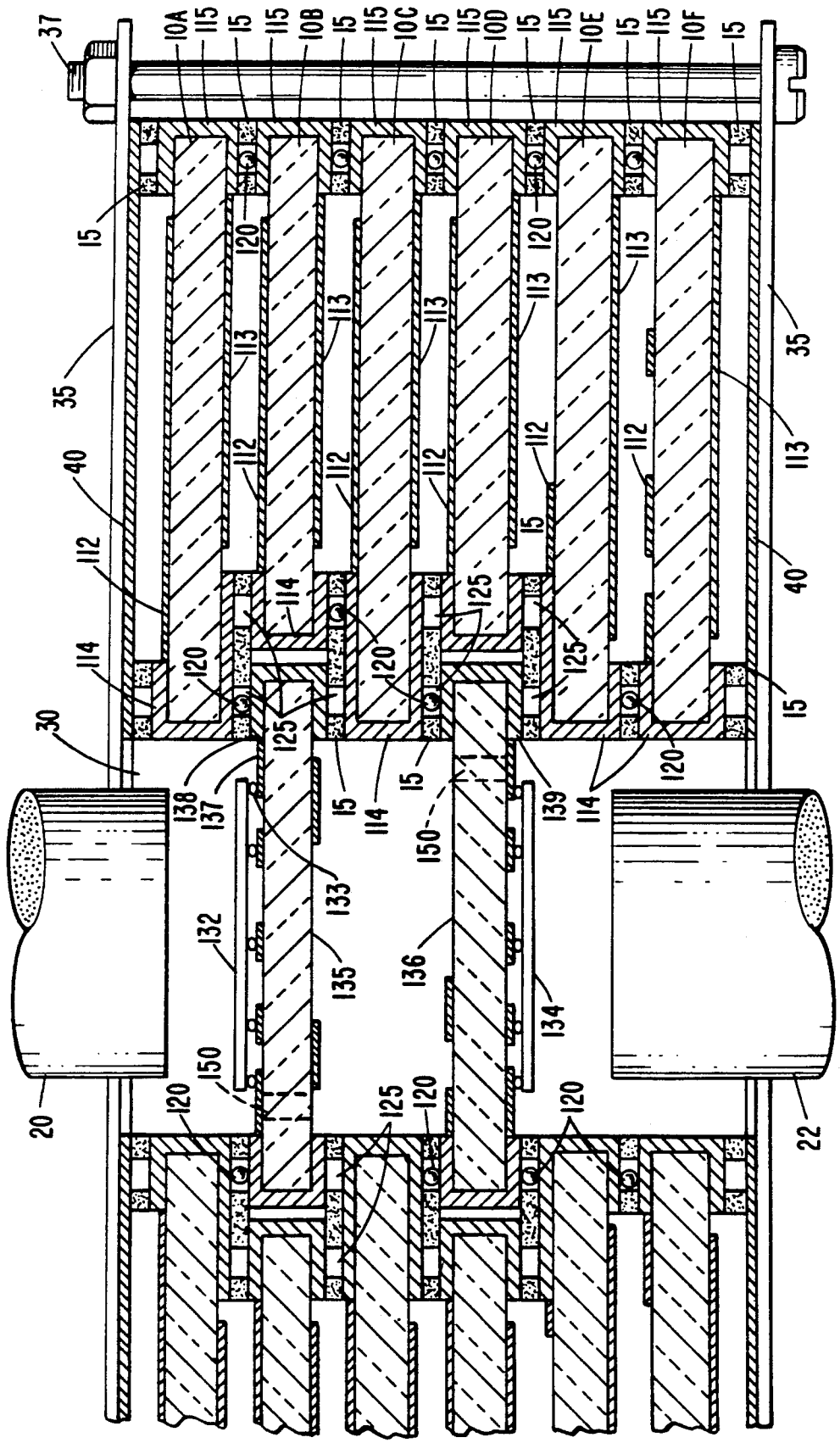
FIG. 2 is a cross section of the structure of FIG. 1 along line 2—2.

FIG. 2 shows a cross section along the line 2—2 of FIG. 1. FIG. 2 shows a plurality of interconnection substrates 10 each of which have deposited thereon strips 112 of superconducting ceramic material and metallic conductive plating 114 in electrical contact with the superconducting strips which may be provided with solder connections (not shown) for external access to the substrates. The plating may, for example, be silver or other metallic electrically conductive material which will not attack the ceramic superconducting material. The ceramic material may be, for example, commercially available 1-2-3 material ($Y_1Ba_2Cu_3O_7$) which may be deposited on substrates, made for example of strontium titanate ($S_rT_iO_3$) material, in a well-known fashion. In the manufacture of the interconnection substrates, the metallic conductors are plated on to the substrate before the superconducting material is deposited in contact with the metallic conductors to avoid heat damage to the superconducting material. Similarly, solder connections to the plated edge conductors to provide external access to the substrates are made before the superconducting material is deposited on the substrate. The substrates 10 are separated by spacers 15 which may be made of a phenolic or other suitable insulating material. Each of the spacers 15 is provided with a plurality of apertures 125, shown in greater detail in FIG. 5, in registration with plated metallic edge conductors 114 on substrates above and below the spacer. Contact devices 120 which may be, for example, a spherically shaped mallable conductive material such as indium, may be selectively inserted in the apertures 125 to selectively establish electrical contact between edge conductors on adjacent substrates, as shown in FIG. 2.

An integrated circuit chip 132, 134, shown in FIG. 2, may be mounted on a carrier substrate 135, 136 in a standard fashion, e.g., via connector 133, and standard metallic plated connections 137 may be made from the circuit chip to a plated edge conductor, e.g., 138. By means of an indium contact device 120, contact is made between the plated edge conductor 138 of the substrate 135 and the plated edge 114 of an interconnection substrate 10A, which is in electrical contact with a strip of superconducting material 112. Other connections from the carrier chip 135 to an interconnection substrate 10C can be made with the insertion of a contact device 120 in one of the spacer apertures 125. In this configuration, substrates 10B and 10D may serve to provide a connecting path between their adjacent substrates (e.g., 10A and 10C or 10C and 10E), but they also provide additional signal paths 112 for connection to the chips. Each of the interconnection substrates 10A through 10F in the illustrative embodiment are a form of a stripline transmission line with ceramic superconducting signal conductors on one surface of the substrate and a ceramic superconducting ground plane on the opposing surface of the substrate. By way of example, each of substrates 10A through 10F has superconducting signal path conductors 112 connected to the plated edge conductors 114 at the edge adjacent to aperture 30 and superconducting ground plane conductors 113 connected to plated edge conductors 115 at the external edge. The ground plane conductors 113 of the several interconnecting substrates are interconnected by means of edge conductors 115 and contact device 120 inserted in spacer apertures between edge conductors 115. Numerous other connections can be made between substrates by selective insertion of contact devices 120 in appropriate spacer apertures 125. By way of example, in the arrangement shown in FIG. 2, a connection is established between superconductive signal path 112 of interconnecting carrier 10B and integrated circuit chip 134 via edge conductors 114 of substrates 10B and 10C and edge conductor 139 of carrier substrate 136.

The carrier substrates 135 and 136 are provided with flow through holes 150 to allow cryogenic fluid to enter the space between the carriers and to allow fluid in liquid or gaseous form to escape when the temperature of the structure is raised above that of liquid nitrogen. Optical fiber cables are shown at 20 and 22, which may contain a plurality of fibers individually communicating with electrooptical devices on the integrated circuit chips. Electrical wires, for example, to supply power to the integrated circuits may also enter the structure via aperture 30, reserving the superconducting paths on the interconnect substrates for high frequency signals. The arrangement of FIG. 2 is shown with two integrated circuit chips facing opposite directions to be accessible to optical fiber cables or the like. When no external access such as fiber optic cables 20 and 22 is needed, integrated circuits may be mounted on both surfaces of chip carrier substrates 135 and 136 and a number of additional chip carriers may be added in the stack structure. Additional apertures such as aperture 30 may be provided in the interconnection substrates 10A through 10D for supporting additional circuit carriers such as carriers 135 and 136.

Figure 3:
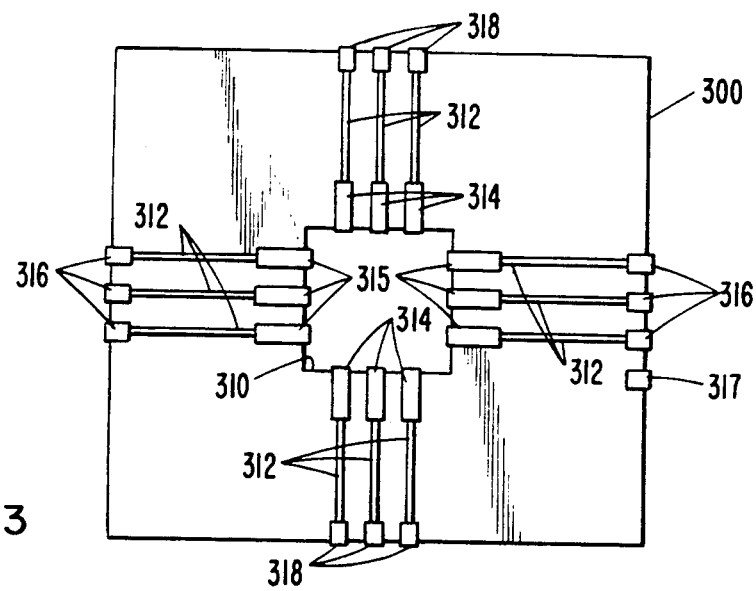
FIGS. 3 and 4 represent top views of exemplary interconnection substrates.
Figure 4:
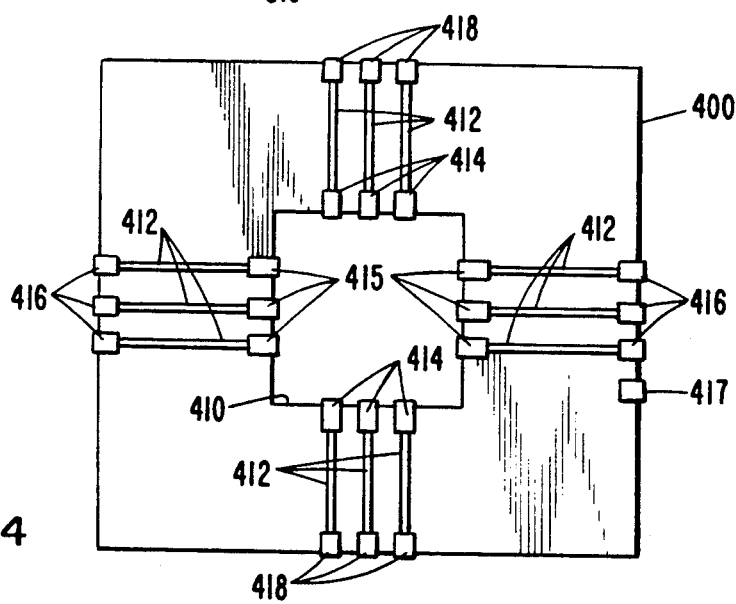

As shown in FIG. 2, certain of the interconnection substrates, for example substrates 10B and 10D have larger central apertures than other substrates, to allow overlapping of the edge conductors 138 and 139 of carrier substrates 135 and 136 with edge conductors 114 of adjacent interconnection substrates (e.g. 10C). This is shown further in FIGS. 3 and 4. FIG. 3 is a top view of an interconnection substrate such as substrate 10A with a central aperture 310, a plurality of superconducting signal paths 312 and aperture edge plated metallic conductors, e.g., 314, in contact with the superconducting strips. Further shown in FIG. 3 are outside edge plated metallic conductors for example 316. External edge conductor 317 is provided to connect to a ground plane on the opposite surface (not shown) of the substrate. FIG. 4 is a top view of an interconnection substrate, e.g., 10B having a larger central aperture 410. FIG. 4 incorporates a similar configuration of superconducting signal paths 412, aperture edge plated metallic conductors 414 and external edge plated metallic conductors 416. External edge conductor 417 is provided to connect to a ground plane on the opposite surface (not shown) of the substrate.

Figure 5:
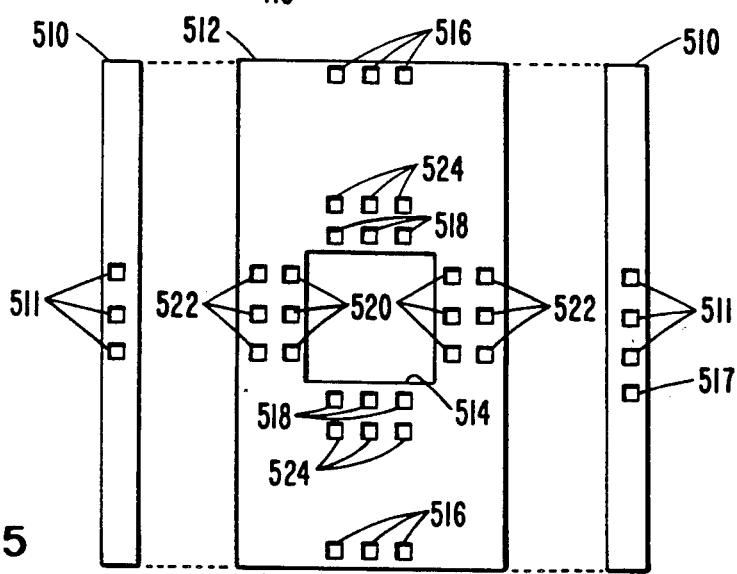
FIG. 5 is a top view of an exemplary intersubstrate spacer.

Shown in FIG. 5 is a top view of a spacer assembly such as shown in FIG. 2. The assembly of FIG. 5 is constructed of separated sections 510 and 512 to provide an opening between adjacent layers of interconnection substrates allowing for the flow of cryogenic fluid to enhance cooling. The external sections 510 are each provided with a plurality of apertures 511 to be aligned with, for example, corresponding external edge plated conductors 316 of the structure of FIG. 3 or external edge plated conductors 416 of the structure of FIG. 4. Aperture 517 is positioned to be aligned with edge conductors 317 and 417 of FIGS. 3 and 4, respectively. The center section 512 is provided with an aperture 514 to be aligned with aperture 310 of FIG. 3 and in aperture 410 of FIG. 4. Spacer 512 is provided with apertures 516 which will be placed in alignment with external edge plated conductors 318 and 418 of FIGS. 3 and 4, respectively. The center section 512 is further provided with apertures 518 which are positioned to be placed in registration with the plated aperture edge conductors 314 of the substrate of FIG. 3, and apertures 520 positioned to be placed in registration with plated aperture edge conductors 315 of the substrate of FIG. 3. The center spacer section 512 is further provided with apertures 524 positioned to be placed in registration with both plated edge conductors 314 of FIG. 3 and 414 of FIG. 4. Similarly, apertures 522 of section 512 are positioned to be placed in registration with both plated edge conductors 315 of FIG. 3 and 415 of FIG. 4. It will be apparent that by insertion of a set of spacers as shown in FIG. 5 between a substrate of FIG. 3 and a substrate of FIG. 4 and inserting, for example, spheres of electrically conducting indium, connection may be selectively established between the plated conductors and hence the superconducting signaling paths of the substrates of FIG. 3 and 4, as shown in FIG. 2. The plated conductors along the edges of the aperture 310 of the substrate of FIG. 3 are designed to extend further on the surface of the substrate to assure alignment with the double row of apertures e.g. 518, 520, 522, 524 around the center aperture, thereby allowing for electrical connection to a chip carrier as shown in FIG. 2.

It is to be understood that the above-described apparatus is merely an illustrative embodiment of the principles of the invention and other apparatus may be readily devised by those skilled in the art without departing from the spirit and scope of our invention.

We claim:

1. Electrical interconnection apparatus comprising:
   a first substrate, a plurality of contact areas consisting of metallic electrically conductive material affixed to said first substrate, and superconducting material deposited on said first substrate for forming a signal transmission path and making electrical contact with said contact areas;
   a second substrate, a plurality of contact areas consisting of a metallic electrically conductive material affixed to said second substrate, and superconducting material deposited on said second substrate for forming a signal transmission path and making electrical contact with said contact areas on said second substrate; and
   retaining means for applying mechanical force to said substrates for maintaining said contact areas of said first substrate and said second substrate in electrical contact;
   said apparatus further comprising spacer means consisting of electrically insulating material disposed between said first and said second substrates and having apertures in said spacer means in registration with said contact areas of said first and said second substrates, and electrically conducting contact devices selectively inserted in certain of said apertures for making electrical contact between contact areas of said first and said second substrates to selectively establish electrical contact between predetermined ones of said contact areas of said first and said second substrates.

2. Electrical interconnection apparatus comprising:
   a first substrate, a plurality of contact areas consisting of metallic electrically conductive material affixed to said first substrate, and superconducting material deposited on said first substrate for forming a signal transmission path and making electrical contact with said contact areas;
   a second substrate, a plurality of contact areas consisting of a metallic electrically conductive material affixed to said second substrate, and superconducting material deposited on said second substrate for forming a signal transmission path and making electrical contact with said contact areas on said second substrate; and
   retaining means for applying mechanical force to said substrates for maintaining said contact areas of said first substrate and said second substrate in electrical contact;
   wherein said first and said second substrates are separated by a space, certain of said contact areas of said first substrate are disposed on one surface of said first substrate and certain of said contact areas of said second substrate are disposed on a surface of said second substrate positioned in opposing relationship to said one surface of said first substrate, said apparatus further comprising a circuit chip carrier substrate having first and second surfaces, circuit chip connector means on one of said surfaces of said carrier substrate, metallic electrically conducting contact areas on said first and said second surfaces, and electrical conductor means for interconnecting said circuit chip connector means and said contact areas on said first and second surfaces;
   said carrier substrate positioned in said space between said opposing surfaces of said first and said second substrates, certain of said contact areas of said carrier substrate positioned substantially in alignment with at least one of said contact areas of each of said first and said second substrates, whereby electrical contact is made between said first and said second substrates and said circuit chip carrier substrate to provide the carrier substrate with access to superconducting transmission paths on said first and said second substrates when said apparatus is submerged in cryogenic fluid.

3. The electrical interconnection apparatus in accordance with claim 2 and further comprising an additional substrate having two surfaces, at least one electrical contact area on each of said two surfaces of said additional substrate, superconducting material deposited on at least one of said surfaces of said additional substrate for forming a signal transmission path connected to certain of said contact areas of said additional substrate and a portion of said carrier substrate being positioned to occupy a first portion of said space between said first and second substrates, and said additional substrate positioned between said first and second substrates to occupy a second portion of said space, and at least one of said certain contact areas of said additional substrate aligned with at least one contact area of said contact areas on said two opposing surfaces of said first and said second substrates, to provide additional signal path access to said carrier chip via one of said first and said second substrates.

4. The interconnection apparatus in accordance with claim 3 and further comprising electrically insulating spacer means disposed between said carrier substrate and said first and said second substrates and disposed between said additional substrate in said first and said second substrates, said spacer means comprising apertures in registration with contact areas of said first and said second substrates, said carrier substrate and said additional substrate; and electrical contact devices selectively inserted in certain of said apertures to selectively establish electrical contact paths between said carrier substrate and said first and said second substrates and between said additional substrate and said first and said second substrates.

5. Apparatus for connecting superconducting transmission paths to an integrated circuit chip, comprising:

a plurality of interconnection substrates and at least one integrated circuit chip carrier substrate;

each of said interconnection substrates comprising metallic contact areas and strips of superconducting material, said strips composed essentially of brittle superconductive material that is superconductive at a temperature of the boiling point of nitrogen, deposited thereon in electrical contact with said contact areas to form signal transmission paths on said interconnection substrates;

at least one carrier substrate comprising connection means for connecting to an integrated circuit chip, metallic contact areas, and conductor means for establishing electrical connection between said connection means and said contact areas on said carrier substrate, said carrier substrate and said interconnection substrates positioned adjacent to one another with contact areas on each of said substrates aligned with a contact area of at least one other substrate; and retainer means for applying force to force aligned contact areas in electrical contact;

and further comprising spacer means disposed between said substrates to provide separation between said substrates in locations other than said contact areas to allow for the flow of cryogenic fluid between said substrates for the cooling of said superconducting material.

6. The apparatus in accordance with claim 5 wherein said spacer means disposed between said substrates comprise apertures in registration with said contact areas, and said apparatus further comprising contact devices inserted in certain of said apertures to selectively provide electrical contact between said aligned contact areas.

7. Apparatus for connecting superconducting transmission paths to an integrated circuit chip, comprising:

a plurality of interconnection substrates and at least one integrated circuit chip carrier substrate;

each of said interconnection substrates comprising metallic contact areas and strips of superconducting material, said strips composed essentially of brittle superconductive material that is superconductive at a temperature of the boiling point of nitrogen, deposited thereon in electrical contact with said contact areas to form signal transmission paths on said interconnection substrates;

at least one carrier substrate comprising connection means for connecting to an integrated circuit chip, metallic contact areas, and conductor means for establishing electrical connection between said connection means and said contact areas on said carrier substrate, said carrier substrate and said interconnection substrates positioned adjacent to one another with contact areas on each of said substrates aligned with a contact area of at least one other substrate; and retainer means for applying force to force aligned contact areas in electrical contact;

wherein each of said interconnection substrates comprises two surfaces, said signal transmission paths being deposited on one of said two surfaces and a ground plane consisting of superconducting material deposited on the other of said two surfaces on each of said interconnection substrates to form stripline transmission lines on said interconnecting substrates, and contact areas in electrical contact with said superconducting ground plane.

8. The apparatus in accordance with claim 7 and further comprising contact devices disposed between said interconnection substrates for electrically interconnecting contact areas of said first and said second interconnection substrates connected to said superconducting ground planes.

9. The apparatus in accordance with claim 8, further comprising:

spacer means disposed between said substrates to provide separation between said substrates in locations other than said contact areas to allow for the flow of cryogenic fluid between said substrates for the cooling of said superconducting material;

wherein said substrates, said spacer means and said contact devices are removable from said retainer means to allow for replacement of substrates and rearrangement of interconnections.

10. Apparatus for connecting superconducting transmission paths to an integrated circuit chip, comprising:

a plurality of interconnection substrates and at least one integrated circuit chip carrier substrate;

each of said interconnection substrates comprising metallic contact areas and strips of superconducting material, said strips composed essentially of brittle superconductive material that is superconductive at a temperature of the boiling point of nitrogen, deposited thereon in electrical contact with said contact areas to form signal transmission paths on said interconnection substrates;

at least one carrier substrate comprising connection means for connecting to an integrated circuit chip, metallic contact areas, and conductor means for establishing electrical connection between said connection means and said contact areas on said carrier substrate, said carrier substrate and said interconnection substrates positioned adjacent to one another with contact areas on each of said substrates aligned with a contact area of at least one other substrate; and retainer means for applying force to force aligned contact areas in electrical contact;

wherein each of the interconnection substrates is provided with an aperture in registration with a corresponding aperture in the other interconnection substrate;

said carrier substrate is disposed between said interconnection substrates and said connection means of said carrier substrate is positioned in alignment with said aperture in said interconnection substrates and edges of said carrier substrate are overlapping with edges of said apertures in said interconnection substrates; and said carrier substrate and said interconnection substrates each comprise contact areas on said overlapping edges for establishing electrical contact between said carrier substrate and both of said interconnection substrates.

11. The apparatus in connection with claim 10 wherein an electro-optical circuit device is positioned on said integrated circuit carrier substrate in alignment with said apertures in said interconnection substrates and an optical signal transmission device is positioned in alignment with said apertures in said interconnection substrates for optical communication with said electro-optical circuit device.

12. Apparatus for interconnecting superconducting transmission paths to integrated circuit chips comprising:

a plurality of interconnection substrates and at least one integrated circuit carrier substrate of predetermined external dimension;

each of said interconnection substrates comprising an aperture and said integrated circuit carrier substrate positioned between two of said interconnection substrates, and having surfaces overlapping surfaces of said interconnection substrates;

an integrated circuit chip positioned on said integrated circuit chip carrier substrate in alignment with said apertures in said two interconnection substrates;

metallic contact areas on said interconnection substrates and superconducting signal paths on said interconnecting substrates in electrical contact with said contact areas;

contact areas on said carrier substrate in electrical contact with said integrated circuit chip, certain of said contact areas of said interconnecting substrates and said carrier substrate located on said overlapping surfaces;

an additional substrate having an aperture larger than said aperture of said two interconnection substrates and larger than the outside dimension of said integrated circuit carrier substrate, and disposed between said two interconnection carriers;

said additional substrate having two surfaces and contact areas on both of said surfaces in alignment with contact areas on said two interconnection substrates;

spacer means disposed between said carrier substrate and said two interconnection substrates and disposed between said additional substrate and said two interconnection substrates, said spacer means comprising apertures in registration with contact areas on said carrier substrate aligned with contact areas on said two interconnection substrates and apertures in registration with contact areas on said additional substrate in alignment with contact areas on said two interconnection substrates, said spacer means providing space between substrates to allow for the flow of cryogenic fluid for the cooling of superconducting materials;

contact devices selectively inserted in said apertures of said spacer means to provide electrical connecting paths between aligned contact areas on adjacent surfaces; and retainer means to retain said substrates and said spacer means in alignment and to apply force to said substrates to maintain physical contact between said contact areas and said contact devices.

13. The apparatus in accordance with claim 12, wherein said contact devices comprise indium.

14. Electrical interconnection apparatus comprising:

a first substrate, a plurality of contact areas consisting of metallic electrically conductive material affixed to said first substrate, and superconducting material composed essentially of brittle superconductive material deposited on said first substrate for forming a signal transmission path and making electrical contact with said contact areas;

a second substrate, a plurality of contact areas consisting of a metallic electrically conductive material affixed to said second substrate, and superconducting material composed essentially of brittle superconductive material deposited on said second substrate for forming a signal transmission path and making electrical contact with said contact areas on said second substrate;

electrically conducting bearing means for separating said first and second substrates at ones of said contact areas of said first and second substrates; and retaining means for applying mechanical force to said substrates for maintaining said contact areas of said first substrate and said second substrate in electrical contact through said bearing means.

15. Apparatus for connecting superconducting transmission paths to an integrated circuit chip, comprising:

a plurality of interconnection substrates and at least one integrated circuit chip carrier substrate;

each of said interconnection substrates comprising metallic contact areas and strips of superconducting material, said strips composed essentially of brittle superconductive material, deposited thereon in electrical contact with said contact areas to form signal transmission paths on said interconnection substrates;

at least one carrier substrate comprising connection means for connecting to an integrated circuit chip, metallic contact areas, and conductor means for establishing electrical connection between said connection means and said contact areas on said carrier substrate, said carrier substrate and said interconnection substrates positioned adjacent to one another with contact areas on each of said substrates aligned with a contact area of at least one other substrate; and electrically conducting bearing means for separating ones of said substrates at ones of said metallic contact areas; and retainer means for applying force to force aligned contact areas into electrical contact through said bearing means.

16. The apparatus in accordance with claim 15 wherein at least two of the interconnection substrates are each provided with an aperture in registration with a corresponding aperture in another of said at least two interconnection substrates;

said carrier substrate is disposed between said interconnection substrates and said connection means of said carrier substrate is positioned in alignment with said aperture in said interconnection substrates and edges of said carrier substrate are overlapping with edges of said apertures in said interconnection substrates; and said carrier substrate and said interconnection substrates each comprise contact areas on said overlapping edges for establishing electrical contact between said carrier substrate and both of said interconnection substrates.

17. Apparatus for connecting a superconducting signal transmission path to an integrated circuit chip, comprising:

an interconnection substrate, a plurality of contact areas consisting of metallic electrically conductive materials affixed to said interconnection substrate, and superconducting material composed essentially of brittle superconductive material deposited on said interconnection substrate for forming a signal transmission path and making an electrical contact with said contact areas;

a circuit chip carrier substrate, circuit chip connector means on said carrier substrate for connecting to a circuit chip metallic electrically conducting contact areas on said carrier substrate and electrical conductor means for interconnecting said connector means and said contact areas on said carrier substrate;

electrically conducting bearing means for separating ones of said substrates at ones of said metallic contact areas;

retaining means for applying force to force aligned contact areas into electrical contact through said bearing means.

18. Apparatus for interconnecting superconducting transmission paths to integrated circuit chips comprising:

a plurality of interconnection substrates and at least one integrated circuit carrier substrate of predetermined external dimension;

each of said interconnection substrates comprising an aperture and said integrated circuit carrier substrate positioned between two of said interconnection substrates, and having surfaces overlapping surfaces of said interconnection substrates;

an integrated circuit chip positioned on said integrated circuit chip carrier substrate in alignment with said apertures in said two interconnection substrates;

metallic contact areas on said interconnection substrates and superconducting signal paths composed essentially of brittle superconductive material on said interconnecting substrates in electrical contact with said contact areas;

contact areas on said carrier substrate in electrical contact with said integrated circuit chip, certain of said contact areas of said interconnecting substrates and said carrier substrate located on said overlapping surfaces;

spacer means disposed between said carrier substrate and said two interconnection substrates, said spacer means comprising apertures in registration with contact areas on said carrier substrate aligned with contact areas on said two interconnection substrates, said spacer means providing space between substrates to allow for the flow of cryogenic fluid for the cooling of superconducting materials;

contact devices selectively inserted in said apertures of said spacer means to provide electrical connecting paths between aligned contact areas on adjacent surfaces; and retainer means to retain said substrates and said spacer means in alignment and to apply force to said substrates to maintain physical contact between said contact areas and said contact devices.

* * * * *